United States Patent [19]

Olivo et al.

[11] Patent Number: 5,600,600

[45] Date of Patent: Feb. 4, 1997

[54] METHOD FOR PROGRAMMING AND TESTING A NONVOLATILE MEMORY

[75] Inventors: Marco Olivo, Bergamo; Marco Maccarrone, Palestro, both of Italy

[73] Assignee: SGS-Thomson Microelectronics S.r.l., Agrate Brianza, Italy

[21] Appl. No.: 381,530

[22] Filed: Jan. 31, 1995

[30] Foreign Application Priority Data

Jan. 31, 1994 [EP] European Pat. Off. ............. 94830032

[51] Int. Cl.$^6$ .................................................. G11C 7/00
[52] U.S. Cl. .................................... 365/201; 371/21.1
[58] Field of Search .......................... 365/201; 371/21.1, 371/21.2

[56] References Cited

U.S. PATENT DOCUMENTS

| | | | |
|---|---|---|---|
| 4,951,254 | 8/1990 | Hans Ontrop et al. .................. | 365/201 |
| 4,970,727 | 11/1990 | Yoshikazu et al. ..................... | 371/21.3 |
| 5,224,070 | 6/1993 | Iandrich et al. ......................... | 365/201 |
| 5,321,699 | 6/1994 | Endoh et al. ............................ | 371/21.5 |

FOREIGN PATENT DOCUMENTS

| | | |
|---|---|---|
| 0317014 | 5/1989 | European Pat. Off. . |
| 0573816 | 12/1993 | European Pat. Off. . |
| 1131085 | 3/1967 | United Kingdom . |

*Primary Examiner*—Son Dinh
*Attorney, Agent, or Firm*—David M. Driscoll; James H. Morris

[57] ABSTRACT

A method for testing an electrically programmable nonvolatile memory including a cell matrix and an internal state machine which governs the succession and timing of the memory programming phases includes excluding the internal state machine, modifying at least one of the control signals to program the cell matrix, and verifying programming correctness.

33 Claims, 3 Drawing Sheets

METHOD FOR PROGRAMMING AND TESTING A NONVOLATILE MEMORY

BACKGROUND OF THE INVENTION

1. Field of the Invention

The present invention relates to a method for programming and subsequently verifying a non-volatile memory.

More specifically, the present invention relates to a method for testing an electrically programmable non-volatile memory which includes a cell matrix and a state machine that governs the succession and timing of the memory programming phases through control signals.

2. Discussion of the Related Art

In very complex electronic devices such as, for example, non-volatile memories of the FLASH type, the testability aspect takes on considerable importance and should be evaluated during design.

As is known, a non-volatile memory circuit integrated on a semiconductor device includes a rather high number of memory cells structured essentially as a matrix. The cells are organized in word lines and bit lines. To program a certain cell the appropriate voltages must be brought to the respective word and bit lines which identify it.

In memories of this type, it is useful to verify correct operation of the matrix of the memory cells as well as the digital and/or analog control circuitry in the device.

To verify the absence of faults in the cell matrix it is useful to first carry out programming of the memory and to subsequently verify the correctness thereof.

Therefore, to perform the test, one conventionally uses the programming procedure and related circuitry provided for the purpose.

However, the programming is correct only if the related circuitry, i.e. the state machine, address decoders, the analog voltage generators, the control units, etc., are effectively and perfectly operating.

Additionally, it is not possible to change in a simple manner the duration of the programming and verification phases.

An object of the present invention is to provide a method for testing an electrically programmable non-volatile memory which allows greater testing speed and at the same time overcomes the shortcomings described above.

SUMMARY OF THE INVENTION

The present invention excludes during testing the internal state machine which in the user's programming procedure governs the succession and timing of the various programming phases.

One aspect of the invention is directed to a method for testing an electrically programmable non-volatile memory that includes a cell matrix coupled to control circuitry, responsive to control signals which govern succession and timing of memory programming phases. The method includes the steps of excluding an internal state machine of the control circuitry, and modifying the function of at least one of the control signals to directly program the cell matrix and subsequently verify programming correctness.

Another aspect of the invention is directed to a method for testing an electrically programmable non-volatile memory having control circuitry, a cell matrix coupled to the control circuitry, and control lines coupled in a first configuration to the control circuitry. The method includes the steps of disabling an internal state machine of the control circuitry during a test mode activation phase coupling the control lines in a second configuration to the control circuitry during the test mode activation phase, applying test signals to the control lines to program the cell matrix during a test performance phase, and verifying that the cell matrix is programmed correctly during a programming correctness verification phase.

Another aspect of the invention is directed to an electrically programmable non-volatile memory device. The device includes a cell matrix, control lines, and control circuitry coupled between the cell matrix and the control lines. The control circuitry includes an internal state machine, and test circuitry. The test circuitry has means for disabling the internal state during a test mode activation phase, means for switching the control lines in from a first configuration to a second configuration during the test mode activation phase, means for applying test signals to the control lines to program the cell matrix during a test performance phase, and means for verifying that the cell matrix is programmed correctly during a programming correctness verification phase.

Another aspect of the invention is directed to an electrically programmable non-volatile memory device. The device includes a cell matrix, control lines, and control circuitry coupled between the cell matrix and the control lines. The control circuitry includes an internal state machine, and test circuitry. The test circuitry has disabling circuitry that disables the internal state during a test mode activation phase, switching circuitry that switches the control lines in from a first configuration to a second configuration during the test mode activation phase, applying circuitry that applies test signals to the control lines to program the cell matrix during a test performance phase, and verifying circuitry that verifies that the cell matrix is programmed correctly during a programming correctness verification phase.

DETAILED DESCRIPTION

Figure 1:
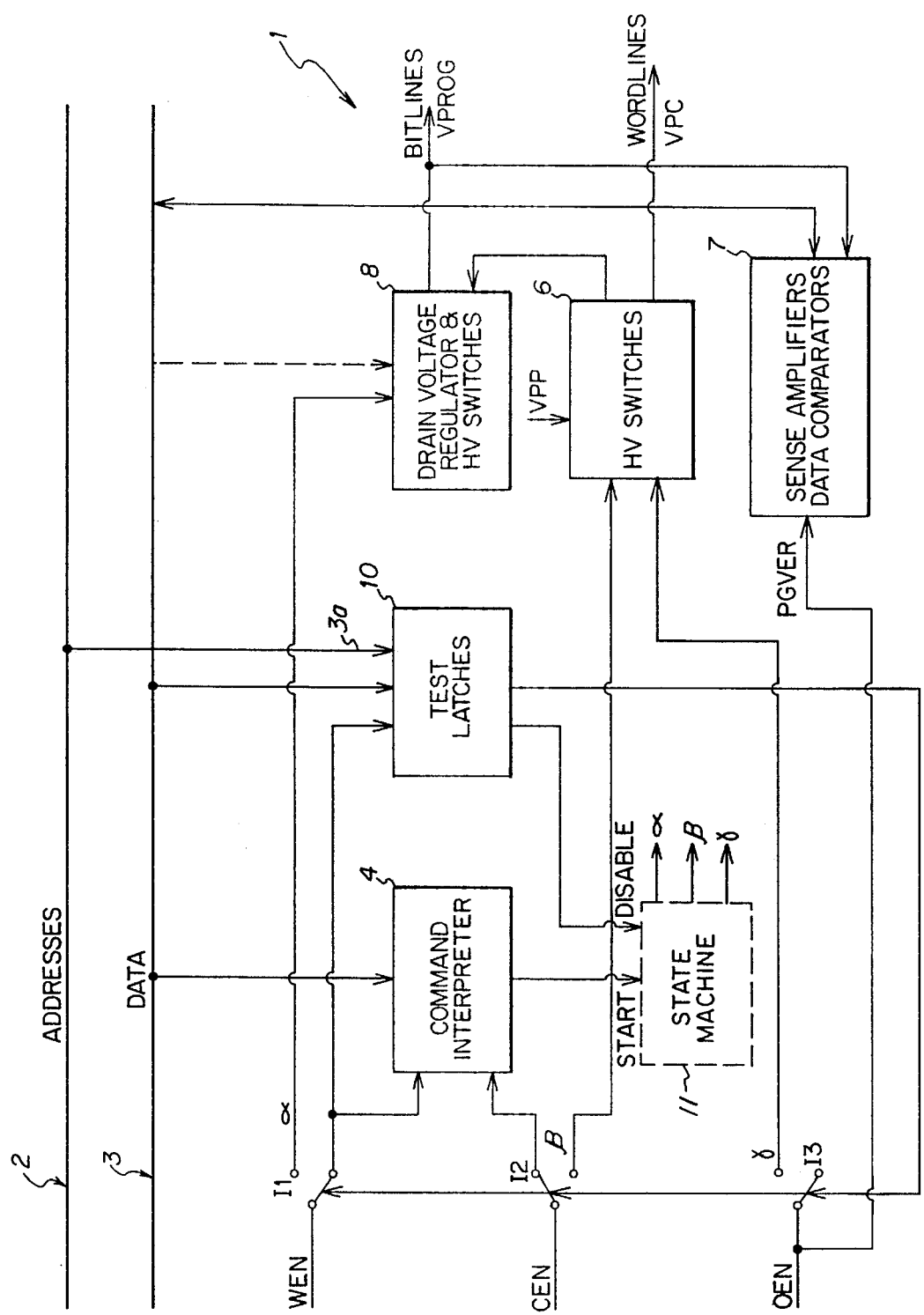
FIG. 1 shows a block diagram of a non-volatile memory device to which is applied the method in accordance with the present invention.

With reference to the figures, FIG. 1 designates a portion of the architecture of an electrically programmable non-volatile memory, e.g. of the so-called FLASH type.

Figure 3:
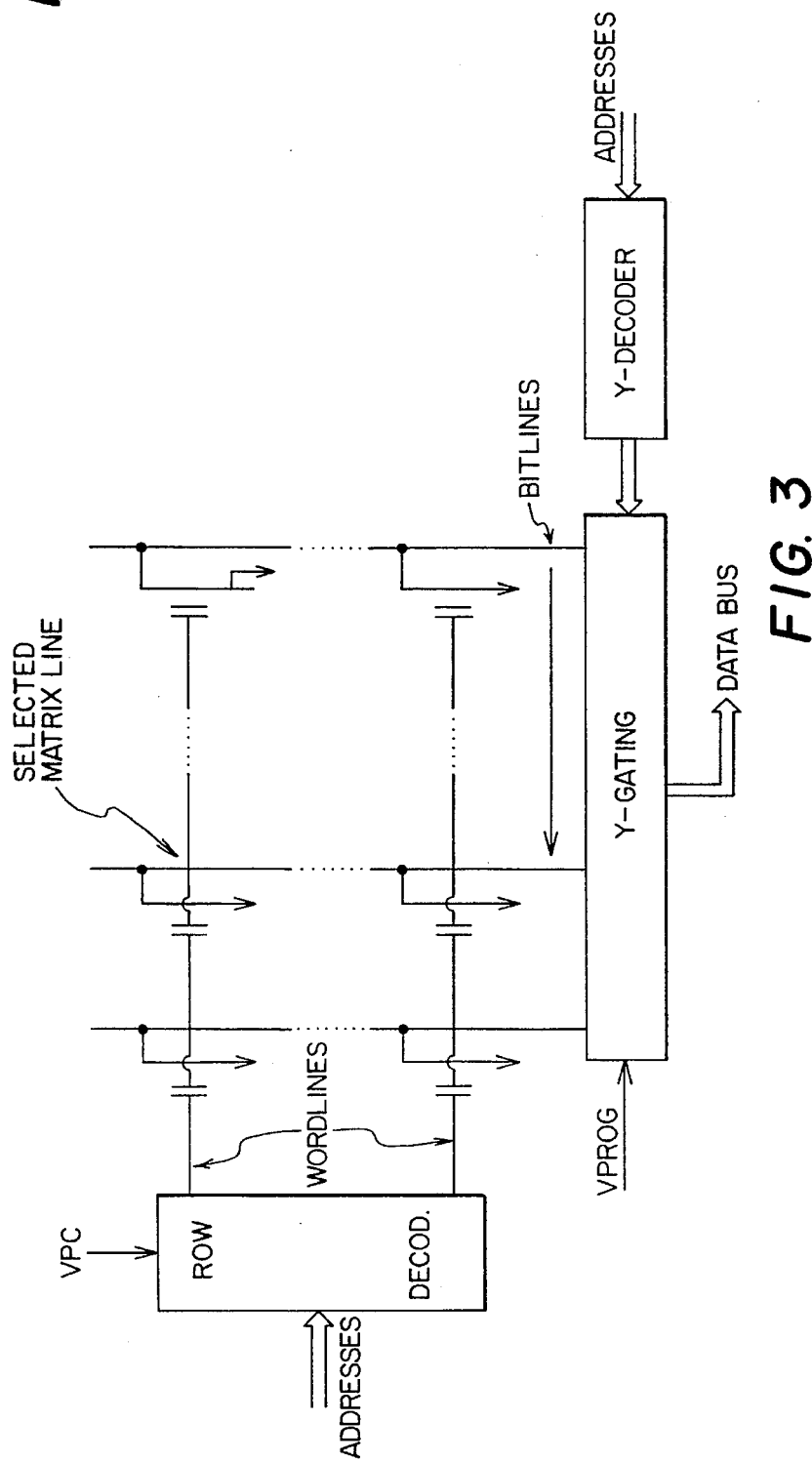
FIG. 3 shows a portion of a cell matrix to which is applied the method in accordance with the present invention.

This portion, an electronic device, is integrated on a semiconductor device and includes a multiplicity of memory cells that are structured basically as a matrix as shown in FIG. 3. The cells are organized in word lines and bit lines. To program a certain cell, the appropriate voltages must be brought to the word and bit lines which identify it.

For this purpose there is provided dedicated circuitry in the memory device including: a generating circuit 6 that generates programming and verification voltages and has an output connected to the word lines, and a programming circuit 8 that has an output connected to the bit lines. A second output of the generating circuit 6 is connected to an input of the programming circuit 8.

The generating circuit 6 receives at an input a signal CEN (Chip Enable) through a two-position switch I2, when switch I2 is in the first position. The second position of this switch I2 connects the CEN signal to a command interpreting circuit 4.

The programming circuit 8 receives at an input a signal WEN (Write Enable) through a two-position switch I1, when the switch I1 is in the first position. The second position of this switch I1, in turn, connects the WEN signal to a command interpreting circuit 4 as well as with test circuitry 10 whose function is described below.

The architecture 1 further includes electrical bus connections 2 and 3 which define a two-way information path from and to the state machine. In particular, there are provided an address bus 2 and a data bus 3.

The address bus 2 is connected 3a at an input to the test circuitry 10. The data bus 3 is connected to an input of both the command interpreting circuit 4 and the test circuitry 10.

Optionally, the data bus is also connected to the programming circuit 8 so as to supply a predetermined configuration of 0 and 1 values to determine which bits of a byte must be programmed.

There is also provided a two-way connection between the data bus 3 and an output buffer circuit 7 which incorporates some comparators. The output buffer circuit 7 receives at an input a signal OEN (Output Enable) through the first position of a two-position switch I3.

The second position of the switch I3 connects the OEN signal to the generating circuit 6.

Advantageously the switches I1, I2 and I3 selectively make the connections of the first and second positions, responsive to an output of the test circuitry 10.

In the test procedure, in accordance with the present invention, some signals have functions other than those performed when not performed in a normal operation mode. The signal WEN performs a function of enablement of the actual programming.

Optionally, together with signal WEN, there is activated another signal DU (i.e., a don't use pin, not shown) which is an external signal that is not usable by the user and which in the test procedure, in accordance with the present invention, is used to discharge the bit lines between the end of the programming phase and the beginning of the verification phase.

The data bus 3 and the address bus 2 of the architecture 1 transport signals DQ and A, respectively. These signals prepare the circuit for the test mode activation phase.

Besides these signals, there are additional control signals that are already present in the circuit, i.e. OEN and CEN.

In the test procedure in accordance with the present invention, the signal OEN enables the verification phase, while the signal CEN enables analog voltage generators in the generating circuit 6 to be used in the programming phase.

The testing procedure in accordance with the present invention, includes two distinct phases:

1. a test mode activation phase, and
2. a test performance phase.

The first phase uses the data bus 3 and address bus 2 and allows application of an appropriate sequence of signals DQ and A to configure the state of some internal signals such as DISABLE as shown in FIG. 1 in the architecture 1. This allows, e.g., performance of a program with multiple bits in parallel or the forcing of a particular bit to a logic state 1 which, in the test registers, indicates the starting of the test mode activation phase.

In detail, the test circuitry 10, upon receiving a test mode activation signal from the address bus 2 and data bus 3, switches the position of the switches I1, I2 and I3 to exclude the internal state machine 11 during the performance of the test and to change the normal functions of the above listed signals.

The switch I1 is normally positioned so that the signal WEN is applied to the command interpreting circuit 4. In the test procedure in accordance with the present invention, the position of the switch I1 is changed to supply the signal WEN to the programming circuit 8 connected to the bit lines of the memory matrix.

The switch I2 is normally positioned so that the signal CEN is applied to the command interpreting circuit 4. In the test procedure, in accordance with the present invention, the switch I2 is operated so as to transfer the signal CEM to the generating circuit 6.

The switch I3 is normally open. In the test procedure in accordance with the present invention, it applies the signal OEN to the input of said generator 6.

The signal OEN is also applied directly to the output buffer circuit 7 through a branch upstream of the switch I3.

The above operational phases have the practical effect of excluding the internal state machine 11 in the memory device.

Consequently, having excluded the internal state machine 11, the addresses can be used freely and, using the above listed control signals with their new meaning, the desired cells can be programmed and their correctness can be verified.

The polarities of signals is referred to for an understanding of the illustrative embodiment. However, depending on the technology in which this method is applied, different polarities may be used to the same effect, as would be understood by those skilled in the art.

Figure 2:
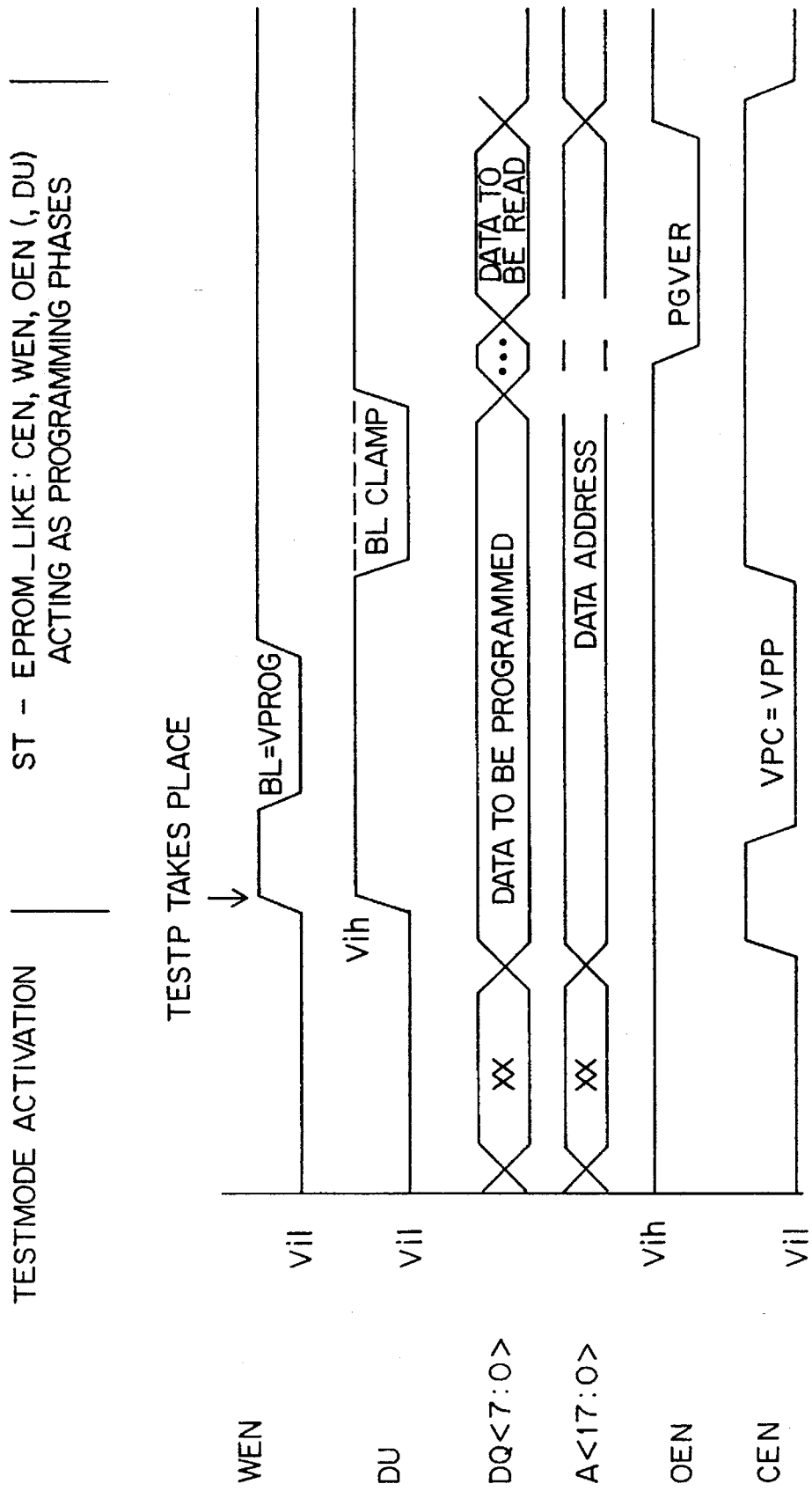
FIG. 2 shows a group of signals having the same time base which are designed to implement a sequence of test phases in accordance with the present invention.
Figure 4:
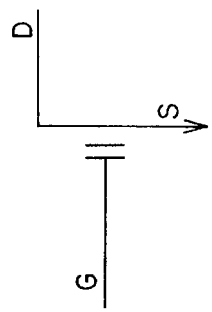
FIG. 4 shows a single cell of the cell matrix to which is applied the method in accordance with the present invention.

The sequence of operations of the method are now described. The signals DU, WEN and CEN are brought to a high voltage Vih at the beginning of the test performance phase as shown in the first chart of FIG. 2. The signal CEN is then brought to a low voltage Vil causing generation of a voltage VPC equal to that of programming (VPC=VPP). The voltage VPC is supplied to the selected matrix line as shown in FIG. 3. The signal WEN returns to the lower value Vil to start actual programming of the bit line (BL =VPROG) and subsequently, this signal is again raised to voltage Vih so as to stop programming. The signal CEN rises so as to return the voltage VPC to the non-programming value. At the end of the programming phase it is also possible to momentarily return the signal DUto the value Vil and again return it to the high value Vih to discharge the bit line before the beginning of verification (BL CLAMP).

The signal OEN is normally high and is lowered to the value Vil to start the verification phase (PGVER) and at the end of the verification phase the signal OEN returns to the high logic value.

Verification is performed by a comparison of the values present after memory programming with the correct ones supplied through the data bus 3. The signal CEN also returns to a low logic value Vil and the circuit is ready to perform a new test or return to normal operation.

The test method in accordance with the present invention has the following advantages: The memory matrix test can be performed in a manner fully independent of control unit operation. The duration of the programming pulse and that of the verification phase are not bound to the internal time base and can thus be selected at will. The sequence of performance of the actual test is compatible with that used for testing EPROM memories of the known art and thus permits use of the same circuitry equipment for its performance.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for testing an electrically programmable non-volatile memory that includes a cell matrix coupled to control circuitry, which circuitry governs succession and timing of memory programming phases in response to control signals, the method comprising the steps of:

disabling an internal state machine of the control circuitry from controlling the cell matrix; and modifying a function of at least one of the control signals so as to directly program the cell matrix, and subsequently verify programming correctness.

2. The method of claim 1, further comprising the steps of:

providing a test mode activation phase;

providing a test performance phase that includes the step of programing memory cells of the cell matrix; and providing a programming correctness verification phase.

3. The method of claim 2, wherein the step of providing the test mode activation phase includes the step of:

arranging the control circuitry in a predetermined state to provide a second function in response to the control signals which is different from a first function in response to the control signals during normal memory operation.

4. The method of claim 2, wherein the control signals include a write enablement signal to initiate and stop programming of the cell matrix during the test performance phase.

5. The method of claim 2, wherein the control signals include a chip enable signal to enable a generator of programming voltages to be applied to the cell matrix during the test performance phase.

6. The method of claim 2, wherein the control signals include an output enablement signal to initiate and stop the programming correctness verification phase.

7. The method of claim 2, wherein the control signals include an external signal to start a discharge of a bit line of the cell matrix between the end of the test performance phase and the beginning of the programming verification phase.

8. The method of claim 1, wherein the step of modifying includes the step of:

switching transmission paths of the control signals.

9. The method of claim 8, wherein the step of switching includes the step of:

setting a set of switches that is interlocked with test circuitry of the control circuitry.

10. A method for testing an electrically programmable non-volatile memory having control circuitry, a cell matrix coupled to the control circuitry, and control lines coupled in a first configuration to the control circuitry, the method comprising the steps of:

A. disabling an internal state machine in the control circuitry during a test mode activation phase;

B. coupling the control lines in a second configuration to the control circuitry during the test mode activation phase;

C. applying test signals to the control lines to program the cell matrix during a test performance phase; and D. verifying that the cell matrix is programmed correctly during a programming correctness verification phase.

11. The method of claim 10, wherein the control lines include a write enable line that receives a write enable signal during a normal operating mode of the memory, and step C includes the step of:

programming, by the control circuitry, memory cells of the cell matrix when the control circuitry receives a programming signal of the test signals through the write enable line.

12. The method of claim 10, wherein the control lines include a chip enable line that receives a chip enable signal during a normal operating mode of the memory, and step C includes the step of:

generating and applying, by the control circuitry, a programming voltage to memory cells of the cell matrix when the control circuitry receives a programming voltage generation signal of the test signals through the chip enable line.

13. The method of claim 10, wherein the control lines include an output enablement line that receives an output enablement signal during a normal operating mode of the memory, and step D includes the step of:

initiating and stopping, by the control circuitry, the programming correctness verification phase when the control circuitry receives a verify signal of the test signals through the output enablement line.

14. The method of claim 10, wherein the control lines include an external line, and method further includes the step of:

discharging, by the control circuitry, at least one bit line of the cell matrix when the control circuitry receives an external signal of the test signals through the external line.

15. The method of claim 10, wherein the memory includes a switch coupled between each control line and the control circuitry, and step B includes the step of:

switching, by test circuitry of the control circuitry, at least one switch from a first position to a second position.

16. The method of claim 15, wherein step A includes the step of:

receiving, by the test circuitry, a control signal instructing the test circuitry to activate the at least one switch.

17. The method of claim 16, wherein step A further includes the step of:

sending, by the test circuitry, a disable signal to the internal state machine upon receiving the control signal.

18. An electrically programmable non-volatile memory device, comprising:

a cell matrix;

control lines; and control circuitry coupled between the cell matrix and the control lines, the control circuitry including an internal state machine, and test circuitry having
  means for disabling the internal state machine during a test mode activation phase,
  means for switching the control lines from a first configuration to a second configuration during the test mode activation phase,
  means for applying test signals to the control lines to program the cell matrix during a test performance phase, and
  means for verifying that the cell matrix is programmed correctly during a programming correctness verification phase.

19. The device of claim 18, wherein the control lines include a write enable line that receives a write enable signal during a normal operating mode of the memory, and the control circuitry further includes:
  means for programming memory cells of the cell matrix when the control circuitry receives a programming signal of the test signals through the write enable line.

20. The device of claim 18, wherein the control lines include a chip enable line that receives a chip enable signal during a normal operating mode of the memory, and the control circuitry further includes:
  means for generating and applying a programming voltage to memory cells of the cell matrix when the control circuitry receives a programming voltage generation signal of the test signals through the chip enable line.

21. The device of claim 18, wherein the control lines include an output enablement line that receives an output enablement signal during a normal operating mode of the memory, and the control circuitry further includes:
  means for initiating and stopping the programming correctness verification phase when the control circuitry receives a verify signal of the test signals through the output enablement line.

22. The device of claim 18, wherein the control lines include an external line, and control circuitry further includes:
  means for discharging at least one bit line of the cell matrix when the control circuitry receives an external signal of the test signals through the external line.

23. The device of claim 18, wherein means for switching includes:
  plurality of switches coupled between the test circuitry the control lines, each switch capable of switching from a first position to a second position upon receipt of an activation signal from the test circuitry.

24. The device of claim 23, wherein the test circuitry further includes:
  means for sending the activation signal to the plurality of switches upon receiving a control signal through an bus coupled to the test circuitry.

25. The device of claim 24, wherein the test circuitry further includes:
  means for sending a disable signal to the internal state machine upon receiving the control signal.

26. An electrically programmable non-volatile memory device, comprising:
  a cell matrix;
  control lines; and
  control circuitry coupled between the cell matrix and the control lines, the control circuitry including
  an internal state machine, and test circuitry having
  disabling circuitry that disables the internal state during a test mode activation phase,
  switching circuitry that switches the control lines from a first configuration to a second configuration during the test mode activation phase,
  applying circuitry that applies test signals to the control lines to program the cell matrix during a test performance phase, and
  verifying circuitry that verifies that the cell matrix is programmed correctly during a programming correctness verification phase.

27. The device of claim 26, wherein the control lines include a write enable line that receives a write enable signal during a normal operating mode of the memory, and the control circuitry further includes:
  programming circuitry that programs memory cells of the cell matrix when the control circuitry receives a programming signal of the test signals through the write enable line.

28. The device of claim 26, wherein the control lines include a chip enable line that receives a chip enable signal during a normal operating mode of the memory, and the control circuitry further includes:
  generating and applying circuitry that generates and applies a programming voltage to memory cells of the cell matrix when the control circuitry receives a programming voltage generation signal of the test signals through the chip enable line.

29. The device of claim 26, wherein the control lines include an output enablement line that receives an output enablement signal during a normal operating mode of the memory, and the control circuitry further includes:
  initiating and stopping circuitry that initiates and stops the programming correctness verification phase when the control circuitry receives a verify signal of the test signals through the output enablement line.

30. The device of claim 26, wherein the control lines include an external line, and control circuitry further includes:
  discharging circuitry that discharges at least one bit line of the cell matrix when the control circuitry receives an external signal of the test signals through the external line.

31. The device of claim 26, wherein switching circuitry includes:
  a plurality of switches coupled between the test circuitry the control lines, each switch capable of switching from a first position to a second position upon receipt of an activation signal from the test circuitry.

32. The device of claim 31, wherein the test circuitry further includes:
  first sending circuitry that sends the activation signal to the plurality of switches upon receiving a control signal through an bus coupled to the test circuitry.

33. The device of claim 32, wherein the test circuitry further includes:
  second sending circuitry that sends a disable signal to the internal state machine upon receiving the control signal.

\* \* \* \* \*